(12) United States Patent
Shim et al.

(10) Patent No.: US 6,524,430 B1
(45) Date of Patent: Feb. 25, 2003

(54) APPARATUS FOR FABRICATING A SEMICONDUCTOR DEVICE

(75) Inventors: Kyung Sik Shim, Songnam-shi (KR); Chul Ju Hwang, Songnam-shi (KR)

(73) Assignee: Jusung Engineering Co., Ltd. (KR)

( * ) Notice: Subject to any disclaimer, the term of this patent is extended or adjusted under 35 U.S.C. 154(b) by 136 days.

(21) Appl. No.: 09/667,961

(22) Filed: Sep. 21, 2000

(30) Foreign Application Priority Data

Sep. 21, 1999 (KR) .............................................. 99-40555

(51) Int. Cl.[7] .............................. H01L 21/00; H05H 1/00
(52) U.S. Cl. ................................ 156/345.43; 118/723 E
(58) Field of Search ....................... 156/345.47, 345.43; 118/723 E; 204/298.06, 298.34

(56) References Cited

U.S. PATENT DOCUMENTS

| | | | | |
|---|---|---|---|---|
| 4,616,597 A | * | 10/1986 | Kaganowicz | 118/50.1 |
| 4,871,421 A | * | 10/1989 | Ogle et al. | 156/345.44 |
| 5,057,185 A | * | 10/1991 | Thomas et al. | 118/50.1 |
| 5,162,633 A | * | 11/1992 | Sonobe et al. | 156/345.42 |
| 5,213,650 A | * | 5/1993 | Wang et al. | 118/723 R |
| 5,228,052 A | * | 7/1993 | Kikuchi et al. | 118/728 |
| 5,314,603 A | | 5/1994 | Sugiyama et al. | 204/298 |
| 5,795,831 A | * | 8/1998 | Nakayama et al. | 156/345.36 |
| 5,817,534 A | | 10/1998 | Ye et al. | 438/10 |

* cited by examiner

Primary Examiner—Thi Dang
(74) Attorney, Agent, or Firm—Marger Johnson & McCollom, P.C.

(57) ABSTRACT

An apparatus for fabricating a semiconductor device comprising: a reactor for providing a reaction region separated from outside; a pedestal arranged within said reactor to support a semiconductor substrate; a substrate transport port for loading said semiconductor substrate into said reactor; and upper and lower plasma electrodes for generating plasma within said reaction region, said upper and lower plasma electrodes being disposed in the upper and lower portions of said reaction region in respect to said pedestal, respectively. The apparatus further comprise a slot valve plasma electrode within the substrate transport port, and the slot valve plasma electrode is connected to the lower plasma electrode via an RF wire. Also, the upper and lower plasma electrodes are connected to the same RF power supply. According to the present invention, the region lower than the pedestal and the substrate transport port are dry cleaned by plasma generated by the lower plasma electrode and the slot valve plasma electrode, so an additional wet cleaning is not required. Therefore, generation of undesired particles of the prior art can be prevented.

5 Claims, 2 Drawing Sheets

APPARATUS FOR FABRICATING A SEMICONDUCTOR DEVICE

BACKGROUND OF THE INVENTION

1. Field of the Invention

The present invention relates generally to an apparatus for fabricating a semiconductor device, and more particularly to an apparatus for fabricating a semiconductor device further comprising an additional plasma electrode within a reactor so that the inside of the reactor can be cleaned effectively by plasma.

2. Description of the Related Art

In general, many semiconductor wafer fabrication processes carried out in RF (Radio Frequency) plasma reactors leave contaminant deposits on the reactor chamber walls, which accumulate and become the source of particles harmful to the yield of a semiconductor device. Accordingly, the reactor is required to be cleaned frequently to prevent any undesired particles from being produced within the reactor during fabricating of a semiconductor device within the reactor. In general, in a semiconductor device fabricating process using plasma, plasma which is used in the fabricating process is used itself for cleaning the inside of the reactor. However, when the reactor has a complex structure, the reactor may not be cleaned everywhere due to the geometric configuration of the reactor. Therefore, an additional wet cleaning is required frequently, which is subject to generation of undesired particles during a process for fabricating a semiconductor device.

FIG. 1 is a schematic view for illustrating an apparatus for fabricating a semiconductor device according to the prior art.

In particular, the reactor which provides a reaction region separated from outside comprises a chamber 60 and a quartz dome 30 covering the upper portion of the chamber 60. The quartz dome 30 is covered with a bell jar 10, the inside of which is configured like a dome, and a plasma electrode 20, covering the inner wall of the bell jar 10, is disposed between the quartz dome 30 and the bell jar 10. The plasma electrode 20 configured like a dome is connected to an RF power supply 50 via an RF cable 40.

A substrate transport port 70 for loading a semiconductor substrate into the chamber 60 is arranged in the side wall of the chamber 60, and a pedestal 80 for supporting the loaded semiconductor substrate is placed inside the chamber 60. Here, the substrate transport port 70 is opened and closed by a slot valve (not shown). The pedestal 80 can move up and down using supporting means 90. A gas inlet and a gas outlet for introducing and exhausting gas into/from the reactor are not shown for the sake of brevity.

A method for forming a thin film on a semiconductor substrate by using such an apparatus as shown in FIG. 1 is as follows:

First, a semiconductor substrate is loaded into the chamber 60 through the substrate transport port 70 and settled onto the pedestal 80. Then, the pedestal 80 is positioned at the optimal height for the process to be performed by using the supporting means 90. In this state, the inside of the reactor is evacuated into a high vacuum state by a vacuum pump (not shown).

Then, gas is introduced and RF power is applied to the plasma electrode 20 to generate plasma. In this case, plasma is not generated in the region lower than the pedestal 80 or in the substrate transport port 70, but generated only between the pedestal 80 and the plasma electrode 20. When the generated plasma is stabilized, source gas is introduced to form a film on the semiconductor substrate.

When the film forming process described above is over, the semiconductor substrate is unloaded from the reactor, and then plasma is generated again as the same way as above to perform a dry cleaning to the inside of the reactor by using the generated plasma. But plasma is generated only between the pedestal 80 and the plasma electrode 20 as described above, the dry cleaning by the generated plasma is not performed in the region lower than the pedestal 80 and in the substrate transport port 70.

Therefore, an additional wet cleaning is required frequently in the region lower than the pedestal 80 and in the substrate transport port 70, thereby causing a problem that undesired particles are generated during a process for fabricating a semiconductor device.

SUMMARY OF THE INVENTION

Therefore, it is an object of the present invention to provide an apparatus for fabricating a semiconductor device which comprises an additional plasma electrode for cleaning the inside of a reactor so that the reactor can be cleaned everywhere without performing an additional wet cleaning.

According to an embodiment of the present invention to achieve the foregoing object, it is provided an apparatus for fabricating a semiconductor device comprising: a reactor for providing a reaction region separated from outside; a pedestal arranged within the reactor to support a semiconductor substrate; a substrate transport port for loading the semiconductor substrate into the reactor; and upper and lower plasma electrodes for generating plasma within the reaction region, the upper and lower plasma electrodes being disposed in the upper and lower portions of the reaction region in respect to the pedestal, respectively.

The apparatus for fabricating a semiconductor device of the present invention may further comprise a slot valve plasma electrode within the substrate transport port, the slot valve plasma electrode being connected to the lower plasma electrode via an RF wire.

The upper and lower plasma electrodes may be connected to the same RF power supply, wherein an additional RF relay may be preferably provided for alternatively supplying RF power from the RF power supply to the upper or lower plasma electrode. Here, the RF relay electrically connects the RF power supply and the upper plasma electrode for supplying RF power only to the upper plasma electrode when an external input signal is not applied to the RF relay, and electrically connects the RF power supply and the lower plasma electrode while electrically disconnecting the upper plasma electrode from the RF power supply for supplying RF power to the lower plasma electrode when an external input signal of 24 V is applied to the RF relay.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 1:
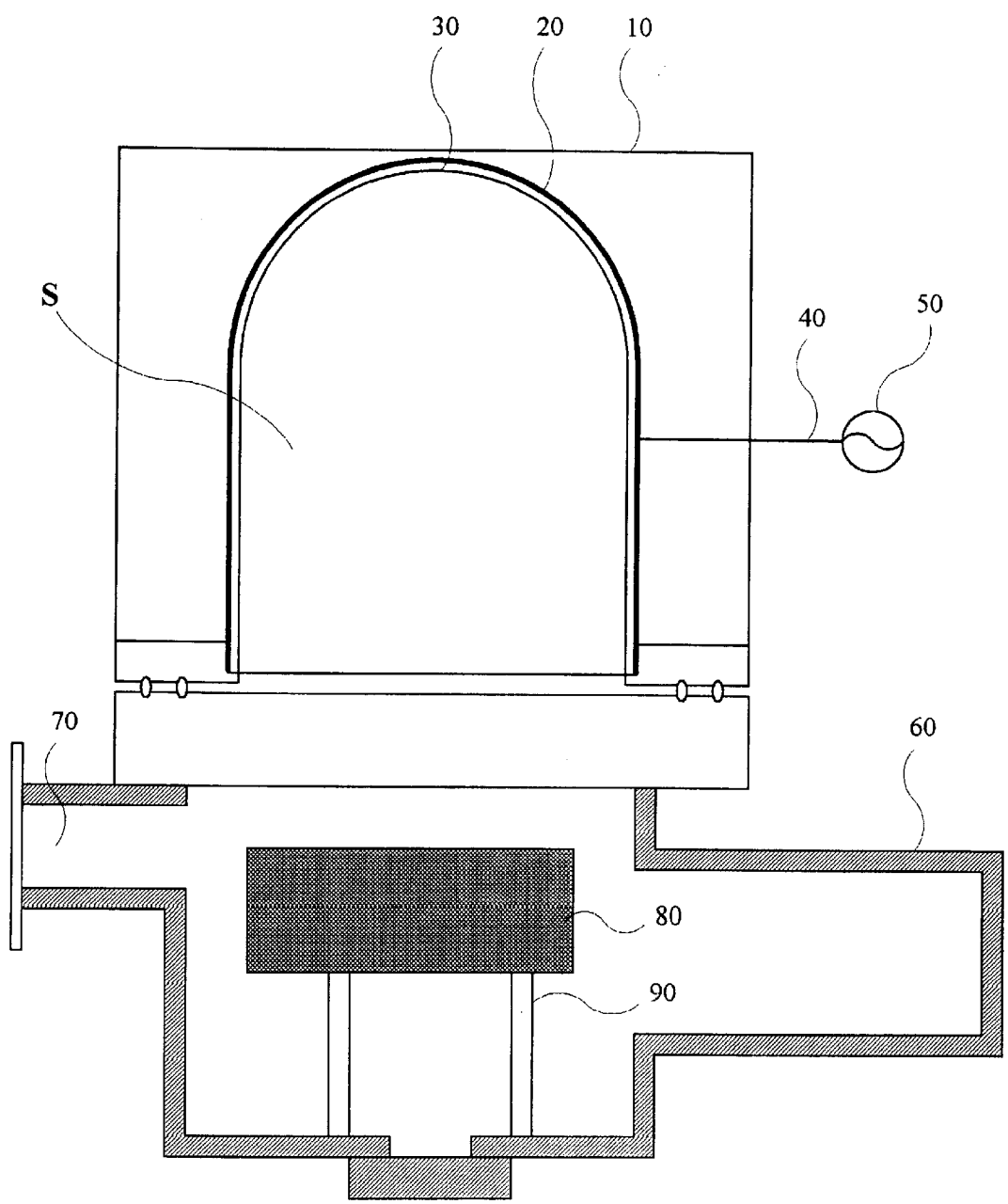
FIG. 1 is a schematic view for illustrating an apparatus for fabricating a semiconductor device according to the prior art.
Figure 2:
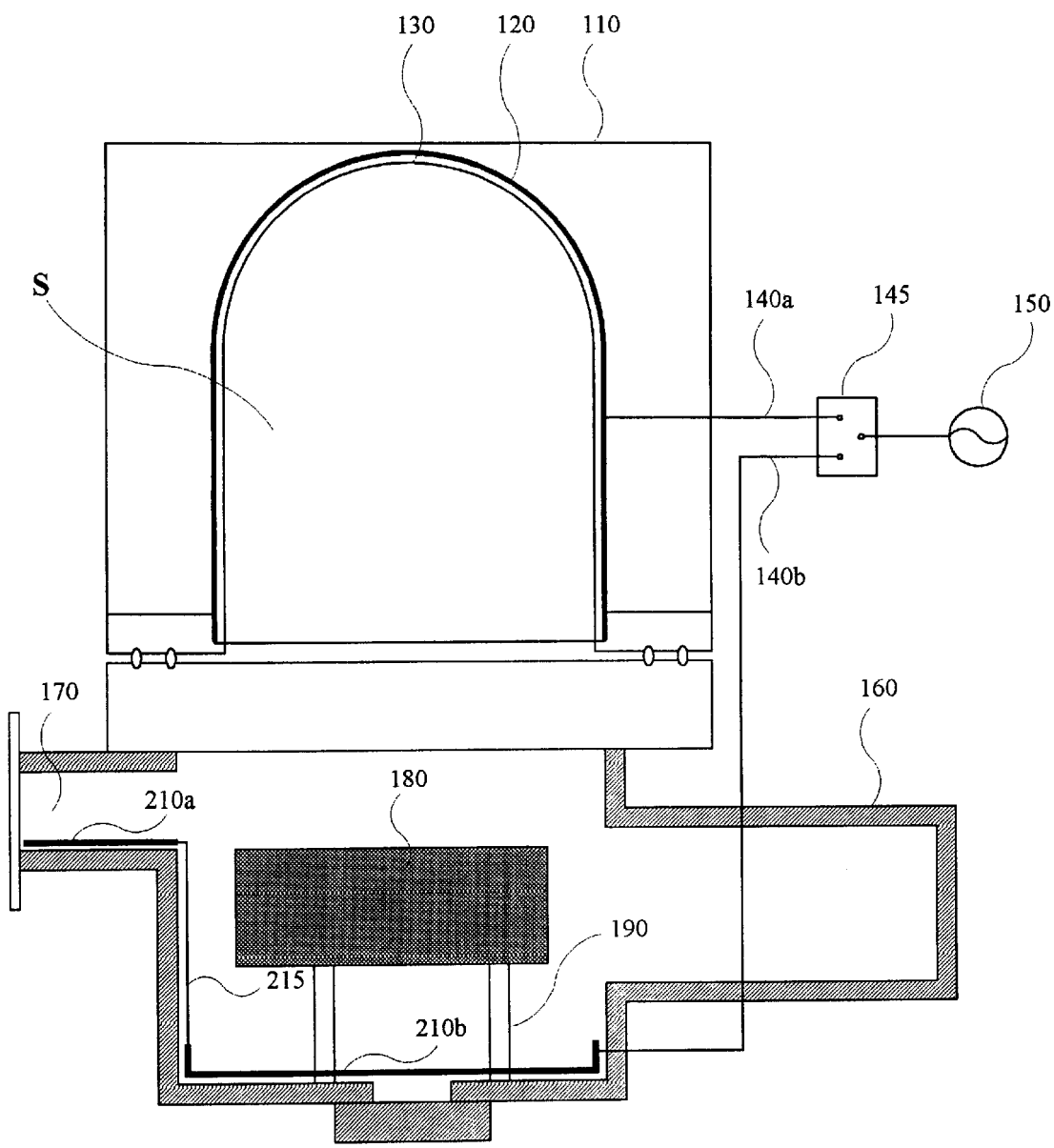
FIG. 2 is a schematic view for illustrating an apparatus for fabricating a semiconductor device according to the present invention.

FIG. 2 is a schematic view for illustrating an apparatus for fabricating a semiconductor device according to the present invention.

Referring to FIG. 2, a reaction region sealed from outside is provided by a reactor which comprises a chamber 160 and a quartz dome 130 covering the upper portion of the chamber 160. The quartz dome 130 is covered with a bell jar 110, the inside of which is configured like a dome, and an upper plasma electrode 120, covering the inner wall of the bell jar 110, is disposed between the quartz dome 130 and the bell jar 110.

A substrate transport port 170 for loading a semiconductor substrate into the chamber 160 is arranged in the side wall of the chamber 160, and a pedestal 180 for supporting the loaded semiconductor substrate is positioned within the chamber 160.

The substrate transport port 170 is opened and closed by a slot valve (not shown). The pedestal 180 can move up and down using supporting means 190. A gas inlet and a gas outlet for introducing and exhausting gas into/from the reactor are not shown for the sake of brevity.

A lower plasma electrode 210b is arranged on the bottom of the chamber 160 to be positioned in the region lower than the pedestal 180, and a slot valve plasma electrode 210a is arranged within the substrate transport port 170. The lower plasma electrode 210b and the slot valve plasma electrode 210a are electrically connected by an RF wire 215. Therefore, supplying RF power to the lower plasma electrode 120 causes the slot valve plasma electrode 210a to be supplied with RF power also. The upper and lower plasma electrodes 120 and 210b are connected to an RF relay via upper and lower RF cables 140a and 140b, respectively. The RF relay 145 serves to alternatively supply RF power from the RF power supply 150 to the upper plasma electrode 120 or the lower plasma electrode 210b.

The RF relay 145 connects the RF power supply 150 and the upper plasma electrode 120 so that RF power may be supplied only to the upper plasma electrode 120 when an external input signal of 24 V is not applied to the RF relay 145, and electrically connects the RF power supply 150 and the lower plasma electrode 210b while electrically disconnecting the upper plasma electrode 120 and the RF power supply 150 with each other so that RF power may be supplied to the lower plasma electrode 210b when an external input signal of 24 V is applied to the RF relay 145.

A process for cleaning the reactor in the apparatus for fabricating the semiconductor device of the present invention is described as follows:

When performing a chemical vapor deposition (CVD), a dry etching, or etc. within the quartz dome 130 by using plasma, an external input signal of 24 V is not applied to the RF relay 145 so that RF power may be supplied only to the upper plasma electrode 120. In this case, plasma is generated only within the quartz dome 130, i.e., between the upper plasma electrode 120 and the pedestal 180.

When cleaning the reactor after a chemical vapor deposition, a dry etching, or etc., plasma is generated only within the quartz dome 130 as above described to clean the region above the pedestal 180, and then an external input signal of 24 V is applied to the RF relay 145 to supply RF power to the lower plasma electrode 210b and the slot valve plasma electrode 210a so that a dry cleaning is performed in the regions lower than the pedestal 180 and in the substrate transport port 170.

Alternatively, instead of the dry cleaning with a time interval like this, the inside of the reactor can be cleaned simultaneously by supplying RF power to the upper and lower plasma electrodes 120 and 210b simultaneously.

According to the embodiment of the present invention described as above, the region lower than the pedestal 180 and the substrate transport port 170 are dry cleaned by plasma generated by the lower plasma electrode 210b and the slot valve plasma electrode 210a, so an additional wet cleaning is not required. Therefore, generation of undesired particles of the prior art can be prevented.

Also, it is preferable that the inside of the reactor can be effectively cleaned by only comprising an additional plasma electrode for cleaning in a suitable place instead of using an additional RF power supply or apparatus for generating plasma.

It should be understood that the present invention is not limited to the above mentioned embodiment, but various other variations and modifications will be apparent to those skilled in the art without departing from the scope and spirit of the present invention.

What is claimed is:

1. An apparatus for fabricating a semiconductor device comprising:

a reactor for providing a reaction region separated from outside;

a pedestal arranged within said reactor to support a semiconductor substrate;

a substrate transport port for loading said semiconductor substrate into said reactor;

upper and lower plasma electrodes for generating plasma within said reaction region, said upper and lower plasma electrodes being disposed in the upper and lower portions of said reaction region in respect to said pedestal, respectively; and a slot valve plasma electrode within said substrate transport port, said slot valve plasma electrode being connected to said lower plasma electrode via an RF wire.

2. The apparatus of claim 1, wherein said upper and lower plasma electrodes are connected to a same RF power supply.

3. The apparatus of claim 2, further comprising an RF relay for alternatively supplying RF power from said RF power supply to said upper or lower plasma electrode.

4. The apparatus of claim 3, wherein said RF relay electrically connects said RF power supply and said upper plasma electrode for supplying RF power only to said upper plasma electrode when an external input signal is not applied to the RF relay, and electrically connects said RF power supply and said lower plasma electrode while electrically disconnecting said upper plasma electrode from said RF power supply for supplying RF power to said lower plasma electrode when an external input signal is applied to the RF relay.

5. The apparatus of claim 4, wherein the voltage level of said external input signal is 24 V.

* * * * *